(12) United States Patent
Rosenfeld et al.

(10) Patent No.: US 8,799,292 B2
(45) Date of Patent: Aug. 5, 2014

(54) METHOD OF GENERATING AN ELEVATION DATABASE

(75) Inventors: Dvir Rosenfeld, Tel Aviv (IL); Eiran Duchovny, Moshav Nir Zvi (IL); Victor Trakhtman, Netanya (IL)

(73) Assignee: Cellguide Ltd., Rehovot (IL)

( * ) Notice: Subject to any disclaimer, the term of this patent is extended or adjusted under 35 U.S.C. 154(b) by 307 days.

(21) Appl. No.: 13/039,473

(22) Filed: Mar. 3, 2011

(65) Prior Publication Data

US 2011/0219009 A1    Sep. 8, 2011

Related U.S. Application Data

(60) Provisional application No. 61/309,889, filed on Mar. 3, 2010.

(51) Int. Cl.
| G06F 17/30 | (2006.01) |
| G01C 21/32 | (2006.01) |
| G01S 19/50 | (2010.01) |
| H03M 7/30 | (2006.01) |
| G01S 19/03 | (2010.01) |

(52) U.S. Cl.
CPC ............... G01C 21/32 (2013.01); G01S 19/50 (2013.01); H03M 7/30 (2013.01); G01S 19/03 (2013.01); *Y10S 707/918* (2013.01); *Y10S 707/92* (2013.01)
USPC ............ 707/743; 707/803; 707/918; 707/920

(58) Field of Classification Search
None
See application file for complete search history.

(56) References Cited

U.S. PATENT DOCUMENTS

| 4,685,068 | A  | * | 8/1987 | Greco et al. | 382/157 |
| 7,071,853 | B2 | * | 7/2006 | Price | 341/65 |
| 7,664,764 | B2 |   | 2/2010 | Biacs |  |
| 2006/0074958 | A1 | * | 4/2006 | Biacs | 707/101 |
| 2007/0061334 | A1 | * | 3/2007 | Ramer et al. | 707/10 |
| 2007/0135992 | A1 | * | 6/2007 | Riise et al. | 701/207 |
| 2009/0210156 | A1 | * | 8/2009 | Riley et al. | 701/300 |
| 2010/0061626 | A1 | * | 3/2010 | Ben-Moshe et al. | 382/163 |

\* cited by examiner

*Primary Examiner* — Belix M Ortiz Ditren
(74) *Attorney, Agent, or Firm* — Mark M. Friedman

(57) ABSTRACT

A method of generating an elevation database for selected geographic regions, the method comprising: receiving a location database, a rule database, and an input elevation database, each location in the location database being located within a selected geographic region; constructing, for each location in the location database and using rules from the rule database, a bounding region enclosing a continuous geographic region; applying elevation data from the input elevation database to each bounding region; and compressing the elevation data in each bounding region to provide compressed elevation data; wherein, upon decompressing the compressed elevation data, each point in each bounding region represents a level of elevation at that point in the associated selected geographic region.

23 Claims, 7 Drawing Sheets

METHOD OF GENERATING AN ELEVATION DATABASE

BACKGROUND

1. Technical Field

Embodiments of the present invention relate generally to satellite-based navigation systems and, more particularly, but not exclusively, to a method of generating a database useful in enhancing the accuracy of such systems in some situations.

2. Description of Related Art

In recent years military and civilian navigation have benefited from the advent of space-based global navigation satellite systems (GNSS). Currently, GNSS systems in active use include the GPS system operated by the U.S.A. and the GLONASS system operated by Russia. In a GNSS system a constellation of satellites in orbit around the Earth transmit signals that are picked up and analyzed by terrestrial receivers to determine a user's position. The receivers may include, for example, handheld units used by pedestrians and military infantry, and on-board receivers installed in automobiles, other motor vehicles, boats, and aircraft.

In order to reach every point on Earth, GNSS systems typically require a minimum of 24 satellites to be in orbit at any one time. However, for security, maintenance, and enhanced accuracy purposes additional satellites may be deployed. The GPS system, for example, has approximately 32 satellites in orbit. At any given time some of the additional satellites may be offline for maintenance, with others are actively transmitting. The number of satellite transmission signals received by a GNSS receiver at any point in time is determined by the receiver's location, and more particularly by the presence or absence of obstacles in the satellite path. For example, a receiver situated in an open plain or on a boat in open sea might receive as many as 12 satellite signals, whereas a receiver located in a valley may only receive half as many.

A user's position in space may be defined by three parameters: latitude, longitude, and elevation. Latitude and longitude may be characterized as horizontal coordinates "x" and "y", and elevation as vertical coordinate "z". Since the clocks used for timing by the satellites and the receivers are not synchronized, a fourth parameter "t", representing the time bias between the user's receiver and the satellite system clock is also required. Accordingly, signal transmissions from four satellites are required to determine the user's position accurately. The four signals provide the mathematical basis for four equations, from which the four unknowns x, y, z, and t, may be solved. The internal calculations are commonly performed using a satellite-oriented coordinate system, and are transformed by the receiver into more familiar latitude, longitude, and elevation figures for the user's convenient reference. This type of solution, in which four satellite signals are used to determine a user's full position in space, is referred to as a 3-D solution.

If a receiver is positioned so that it only receives signals from three satellites, it is still possible to solve the navigation equations by assuming that the user's elevation is known. In such cases the receiver only needs to solve the equations for the three unknowns, x, y, and t, so three received signals are sufficient. Since the user's elevation is not solved, this type of solution is usually referred to as a 2-D solution.

In situations where more than four satellite signals are received, the receiver may employ various algorithms, such as better estimation equations or multipath mitigation techniques, to obtain a solution that is even more accurate than a solution based on four satellite signals.

One of the most difficult situations for modern GNSS receivers occurs when they are used in urban areas such as cities or towns, and particularly in dense urban environments such as the downtown core of major cities. These environments, sometimes known as "urban canyons", are characterized by the presence of many tall buildings. This often creates two significant negative effects on GNSS receiver performance.

A first issue is that the high buildings may simply block the line of sight between the receiver and a transmitting satellite, thereby decreasing the number of satellites visible to the receiver. This may lead, for example, to a less accurate 2-D solution from three satellite measurements instead of a more accurate 3-D solution with four signals or more.

Another issue is that some of the signals that are received may have been reflected along the way from one or more adjacent buildings, travelling from satellite to receiver along a multipath rather than a single, direct path. This issue is exacerbated by the fact that the glass and metal exteriors of modern buildings generally act as reflectors of incident electromagnetic radiation. Furthermore, it is difficult for receivers to identify multipath signals and to distinguish them from direct path signals.

Multipath signals are a problem because their path length is longer than a true line-of-sight signal from satellite to receiver. Due to the fact that the positioning equations solved by the satellite navigation receiver assume a direct line-of-sight between the satellite and the receiver, inaccurate user positioning will result. Satellite receivers do employ multipath mitigation techniques in order to combat the effects of multipath. These techniques usually result in a more complex receiver design.

In the absence of a solution to these and other problems related to urban use of GNSS receivers, the growth opportunities of some aspects of satellite navigation technology may be reduced.

BRIEF SUMMARY

According to an aspect of the present invention, there is provided a method of generating an elevation database for selected geographic regions, the method comprising:

receiving a location database, a rule database, and an input elevation database, each location in the location database being located within a selected geographic region;

constructing, for each location in the location database and using rules from the rule database, a bounding region enclosing a continuous geographic region;

applying elevation data from the input elevation database to each bounding region; and compressing the elevation data in each bounding region to provide compressed elevation data;

wherein, upon decompressing the compressed elevation data, each point in each bounding region represents a level of elevation at that point in the associated selected geographic region.

The method of generating an elevation database further including dividing the bounding regions into a plurality of mapping tiles.

The method of generating an elevation database further including removing from each bounding region any mapping tiles representing areas not from a selected geographic region.

The method of generating an elevation database wherein compressing elevation data comprises separately compressing the elevation data associated with each mapping tile.

The method of generating an elevation database wherein the JPEG method of data compression is used to compress the elevation data associated with the plurality of mapping tiles.

The method of generating an elevation database wherein an average value is calculated for the elevation data associated with each tile, and tiles whose average value produces an allowed compression error for a predetermined minimum portion of the data are assigned a single elevation value equal to the average value.

The method of generating an elevation database wherein the data associated with each tile is compressed by adjusting the JPEG quantization factor to achieve maximum compression for a designated level of distortion.

The method of generating an elevation database wherein the predetermined minimum portion of the data is 95% of the data.

The method of generating an elevation database, further including packing the compressed elevation data associated with the plurality of mapping tiles.

The method of generating an elevation database wherein the packing of the elevation data includes classifying MEG headers by header type, and by storing the header type instead of the header for each mapping tile JPEG file.

The method of generating an elevation database wherein each bounding region is in the form of a rectangular bounding box.

The method of generating an elevation database wherein the bounding box is sized and shaped so that each side of the bounding box is in contact with at least one point of the enclosed continuous geographic region.

The method of generating an elevation database, further including filtering the selected geographic regions according to minimum population size.

The method of generating an elevation database, further including filtering the selected geographic regions according to a designated portion of the world.

The method of generating an elevation database wherein the selected geographic regions are urban regions.

The method of generating an elevation database, wherein the location database is a city location database and the rule database is a rural/urban database.

According to yet another aspect of the present invention, there is provided a method of packing a plurality of compressed data files where each file has compressed data and a header providing decompression information, the method comprising:

identifying any headers that are common to more than one file;

representing each header found in step (a) by a unique header ID;

further representing each header that is not common to more than one file by a unique header ID;

storing each unique header ID and its associated header in an index; and replacing the header in each compressed data file by the associated unique header ID of the header.

The method of packing a plurality of compressed image files wherein the data is compressed by the JPEG method of compression.

According to yet another aspect of the present invention, there is provided a method of generating a terrain elevation database for selected urban regions, the method comprising:

receiving a city atlas database, a rural-urban database, and an input terrain elevation database, the city atlas database containing location coordinates of cities in selected urban regions;

constructing, for each location in the city atlas database and using rules from the rural-urban database, a bounding region enclosing a continuous urban region;

filtering the bounding regions by removing any bounding regions encompassing selected urban regions having a population lower than a minimum population size;

dividing each bounding region into mapping tiles;

removing from each bounding region any mapping tiles representing non-urban areas;

applying terrain elevation data from the input terrain elevation database to each bounding region, to produce a plurality of mapping tile elevation data files;

compressing the elevation data in the plurality of mapping tile files using the JPEG method of compression, wherein each mapping tile is compressed by adjusting the JPEG quantization factor to achieve maximum compression for a designated level of distortion; and packing the plurality of compressed mapping tile data files by classifying JPEG headers of the mapping tile files by header type, and by storing the header type instead of the header for each mapping tile JPEG file;

wherein, upon decompressing the elevation data, each point in each tile represents a level of terrain elevation at that point in the associated selected urban region.

According to yet another aspect of the present invention, there is provided a computer-readable storage medium having computer-readable code embodied on the computer-readable storage medium, the computer-readable code for generating an elevation database for selected geographic regions, the computer-readable code comprising:

program code for receiving a location database, a rule database, and an input elevation database, each location in the location database being located within a selected geographic region;

program code for constructing, for each location in the location database and using rules from the rule database, a bounding region enclosing a continuous geographic region;

program code for applying elevation data from the input elevation database to each bounding region; and program code for compressing the elevation data in each bounding region to provide compressed elevation data.

These, additional, and/or other aspects and/or advantages of the present invention are: set forth in the detailed description which follows; possibly inferable from the detailed description; and/or learnable by practice of the present invention.

BRIEF DESCRIPTION OF THE DRAWINGS

The present invention will be further understood and appreciated from the following detailed description taken in conjunction with the drawings in which:

FIGS. 4C(i) and 4C(ii) are schematic views of the plurality of urban bounding regions of FIG. 4B where the urban bounding regions are divided into mapping tiles;

DETAILED DESCRIPTION

Figure 1:
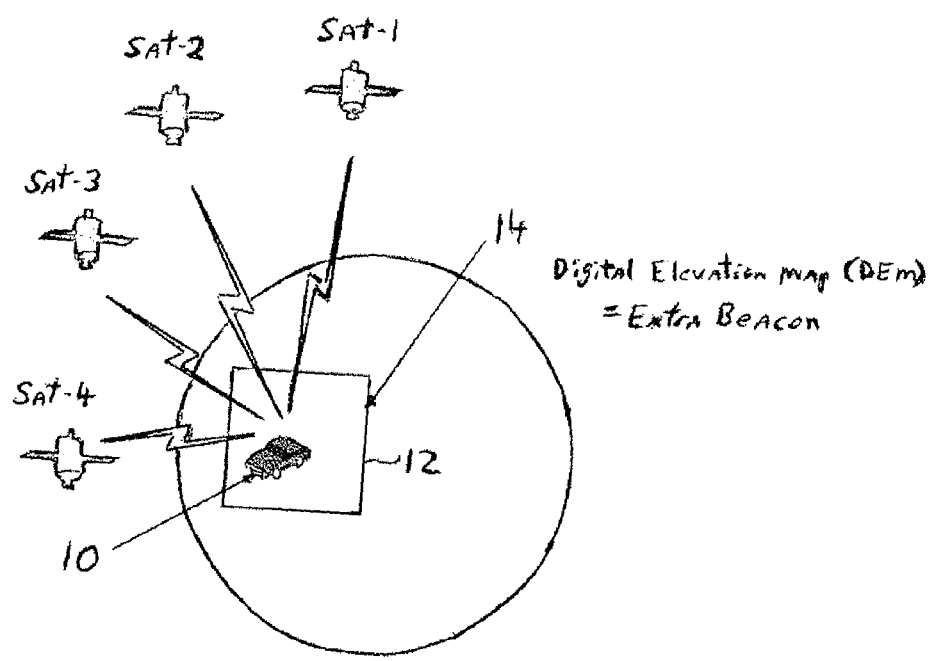
FIG. 1 is a schematic view of a GNSS user receiving signals from four satellites and making use of a digital elevation map generated by a method consistent with an embodiment of the present invention.

Reference will now be made in detail to embodiment(s) of the present invention, examples of which are illustrated in the accompanying drawings, wherein like reference numerals refer to the like elements throughout. The embodiment(s) is/are described below to explain the present invention by referring to the figures.

Referring now to FIG. 1, there is shown a schematic view of a GPS receiver 10 represented as a user in the form of a vehicle. Receiver 10 is located in a selected urban region or city 12, shown in the figure as a rectangle, positioned on a large circle representing the planet Earth. Four navigation satellites identified as "sat-1" to "sat-4" are shown in orbit around Earth, each satellite transmitting a GPS positioning signal that is received by receiver 10. The figure also indicates that receiver 10 is equipped with a digital elevation map ("DEM") 14 that acts as an extra beacon or satellite. DEM 14 is a database that contains elevation data of the terrain or land for selected urban regions in designated portions of the world, including, in FIG. 1, selected urban region 12. DEM 14 is generated using a method consistent with some embodiments of the present invention, as discussed in greater detail below.

In the situation shown in FIG. 1, as noted receiver 12 receives signals from four orbiting satellites. In calculating the user's position, receiver 12 may make use of the four satellite signals and, in addition, the elevation at its current position as provided by DEM 14. In this way a more accurate position measurement may be obtained than the 3-D solution provided by the four satellites alone. In another example, receiver 12 may be located in a portion of selected urban region 12 in which the line-of-sight of one of the four satellite signals is blocked, for example by a tall building, so that only three satellite signals are received. In this case, receiver 12 may make use of the elevation at that position as provided by DEM 14 to obtain, a 3-D solution based on the four inputs of the three satellite signals and the elevation data. In the absence of the DEM elevation data, only a 2-D solution based on three satellite signals would have been possible.

In this way, it is to be appreciated that the elevation data provided by DEM 14 functions in effect like an extra beacon or satellite, since the information provided may be used by receiver 10 to support an additional equation in the calculation of user position, in the same way that a received satellite signal measurement may be used. It may also be noted that even if any of the satellite signals received are multipath signals and inherently inaccurate, the position results provided by receiver 12 are still improved compared to what they would have been otherwise, due to the substantially accurate elevation data provided by DEM 14. Accordingly, the DEM 14 database produced by the method of the present invention may be said to improve both the accuracy and availability of satellite based navigation in urban areas.

Figure 2:
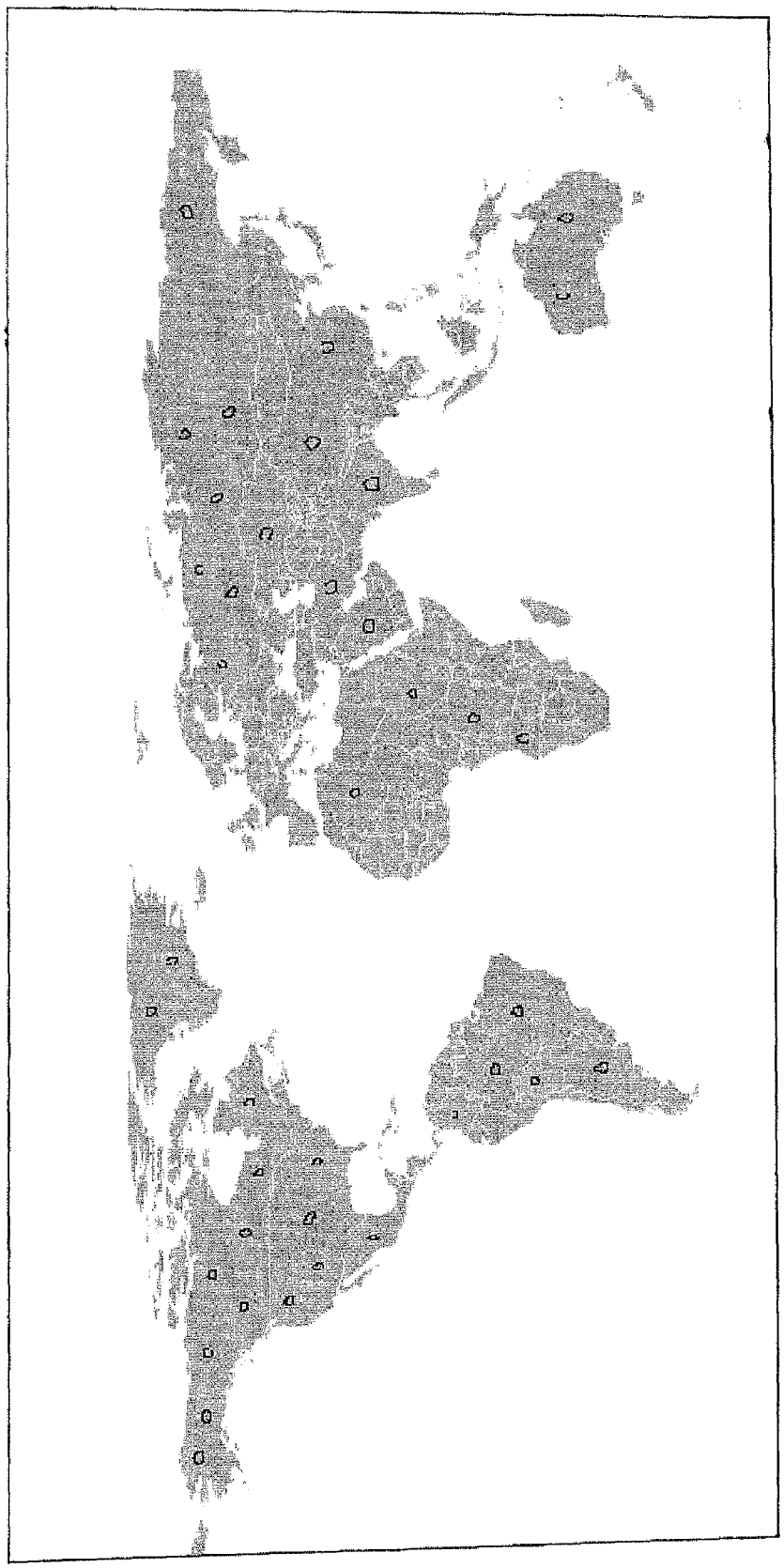
FIG. 2 is a schematic view of Earth showing selected urban regions for which a digital elevation map generated by a method consistent with an embodiment of the present invention may be provided.

FIG. 2 shows a map of the world with various selected urban regions 12 illustrated. According to some embodiments of the invention, DEM 14 may be generated that will contain terrain elevation data for the urban regions shown in this figure. More generally, it is to be appreciated that according to some embodiments of the invention, digital elevation maps may be generated that contain elevation data for selected urban regions in any designated portion or portions of the world. This may include, for example, urban regions in the entire world, or in one or more selected continents, countries, or regions of countries. Further non-limiting examples include digital elevation maps having data for cities in Europe, in North America, in the Americas as a whole, in the United States, in the western states, or in the state of California.

Figure 3:
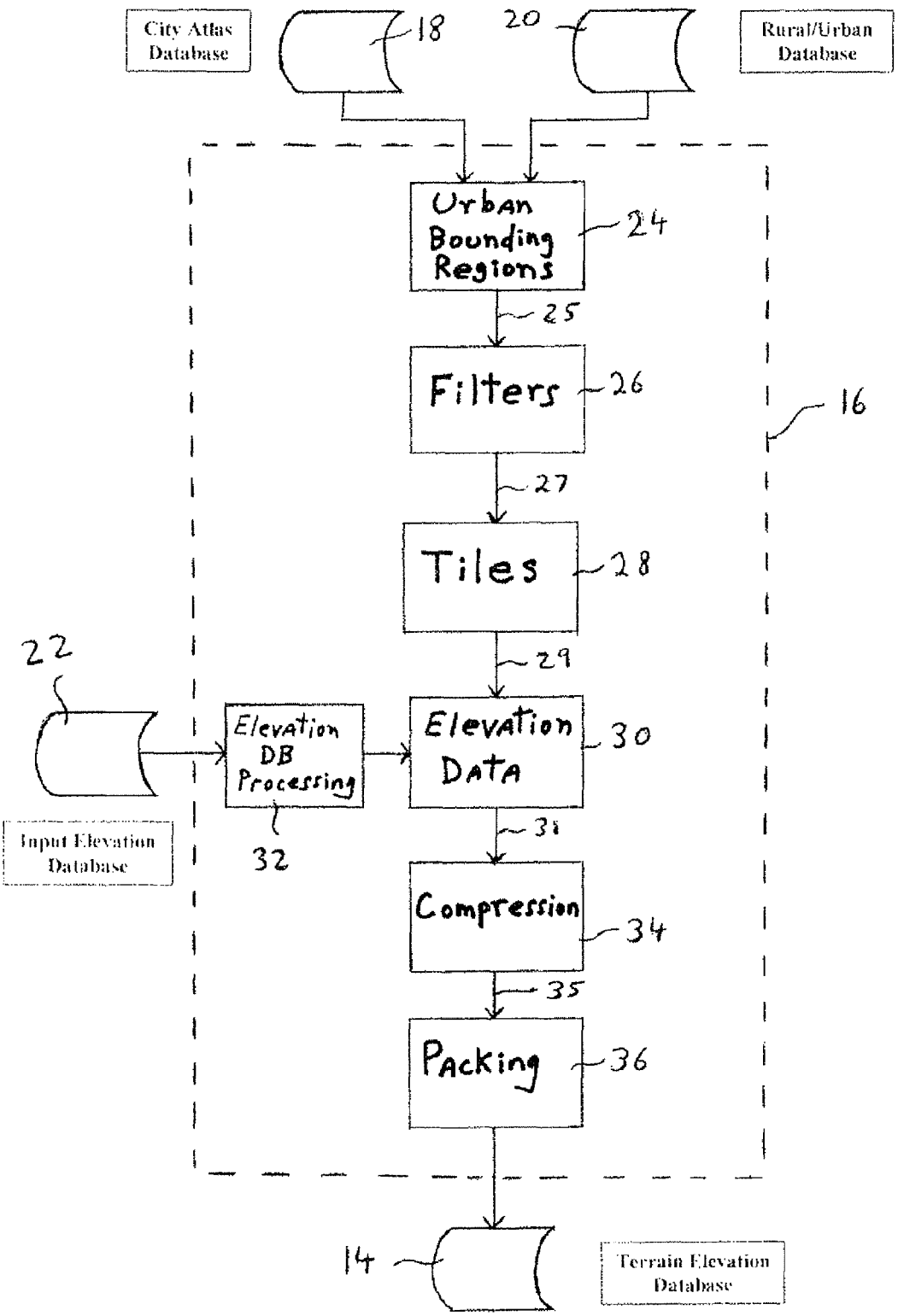
FIG. 3 is a block diagram illustrating the processes or steps employed by an embodiment of the method of the present invention.

FIG. 3 is a block diagram illustrating the method of the present invention, according to some embodiments. A dashed box 16 encloses a series of processing modules that represent the steps and processes of the method. As indicated in the figure by the modules outside dashed box 16, the inputs to the method are a location or city atlas database 18, a rule or rural/urban database 20, and an input elevation database 22. Also indicated is that an output of the method is terrain elevation database or DEM 14. Similarly, the functions or components of the method of the present invention, according to some embodiments, comprise processing modules for bounding regions or urban bounding regions 24, filters 26, tiles 28, elevation data 30, elevation database (db) processing 32, compression 34, and packing 36.

An aspect of the method of the present invention is that output database DEM 14 is produced that is reduced in size from that of the input databases, and in particular input elevation database 22. As will be discussed further below, DEM 14 is sufficiently compact in size so that it may be conveniently installed in and used by GNSS receivers.

A physical device such as computer or other data processor may, together with software, implement or carry out the method of generating an elevation database of the present invention. The computer may be any type of computing device having sufficient processing power and memory to run the software, and that has either sufficient permanent memory to store the input databases, or alternatively, has access to the databases through a data communication connection. The computer may operate in isolation or as part of a shared network. According to some embodiments, a personal computer may be used to generate terrain elevation database 14.

Figure 7:
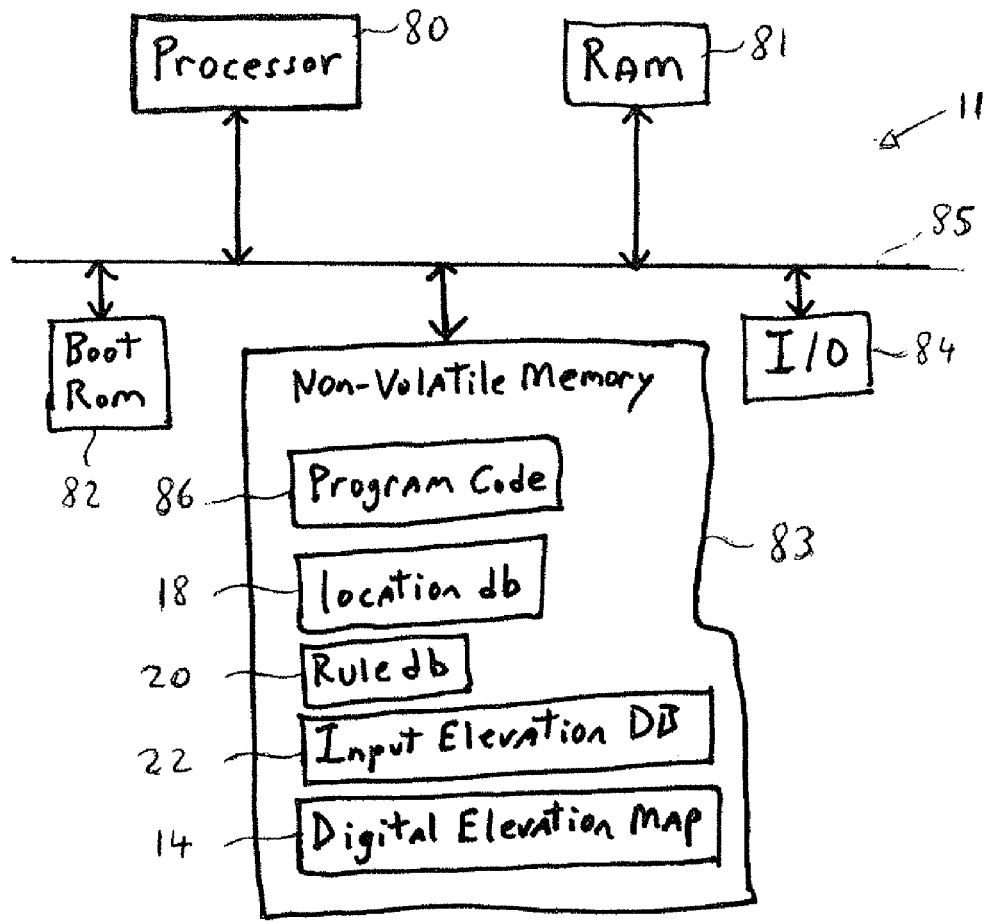
FIG. 7 is a block diagram of a system of generating an elevation database, consistent with an embodiment of the present invention.

FIG. 7 is a block diagram of a system 11 for generating an elevation database consistent with some embodiments of the present invention. System 11 includes a processor 80, a RAM memory device 81, a boot ROM 82, a non-volatile memory 83 such as a hard disk, and an I/O port 84, all communicating with a common bus 85.

Non-volatile memory 83 contains program or software code 86 that processor 80 uses to execute the method of the present invention. The code 86 is transferred to RAM 81 for execution. Non-volatile memory 83 also contains input databases 18, 20, and 22, and output database 14. Non-volatile memory 83 accordingly is an example of a computer-readable code storage medium in which is embedded computer readable code for executing or performing the method of the present invention, according to some embodiments.

The three input databases may cover different portions of the world. However, in order to produce an output DEM 14 covering selected urban regions in a specific desired portion of the world, the three databases should overlap coverage in at least that portion of the world. For example, city atlas 18 may cover all of asia, rural/urban database 20 may cover the country of Korea, and input elevation database 22 may cover the whole world. For these database inputs, output DEM 14 may be provided for selected urban regions in Korea only.

Location or city atlas database 18 provides location information or coordinates of geographical locations of interest, such as cities or urban centers. In some embodiments, the location information may comprise latitude and longitude coordinates in units of degrees. For example, the city of Chicago may have a location database entry of: 41 degrees, 52', 55" N Latitude, and 87 degrees, 37', 40" W Longitude. The specific location or coordinates provided do not have to be in any particular section of the city. For example, the location could be in an approximate center of the city, at a peripheral edge, or anywhere else within the city or urban region.

City atlas database 18 may optionally contain additional fields, such as the city name, population, and the country and/or continent in which the city is located. More particularly, any or all of the input databases may be based on a single data source or on a combination of two or more data sources. For example, city atlas database 18 may comprise a first database containing city location information and population data, and a second database containing city names, countries, and/or continents, indexed by location. All of the data available from any one database, or from any group of databases together, may be designated as metadata.

Rule or rural/urban database 20 provides a rule or information as to whether a particular geographical point or location should be included in a region contained in output DEM 14. For example, in the case where an urban region elevation database such as DEM 14 is being generated, database 20 could be a rural/urban database that provides information as to whether a particular point or location is urban or rural. The database may optionally also inform a third possibility, whether the point is a body of water.

Rural/urban database 20 according to some embodiments of the invention may be provided as a bit map, where the database is organized as a grid and each entry or pixel can be mapped onto a corresponding geographical location. Alternatively, a separate field may be used to identify a pixel's location in latitude/longitude format. Each pixel could be represented by a single bit, for example, where the two possible settings of the bit indicate rural or urban. Alternatively, each pixel could represent two bits to cover three settings of rural, urban, or body of water. In other embodiments, rural/urban database 20 could be a vector type database, as long as the database is able to retrieve the rural or urban identity of any given pixel or location.

Another example of rule or rural/urban database 20 may be a population density database. In this database each pixel may be represented by an eight-bit byte or other standard unit of computer data, that indicates the population density at that point. The method of the present invention, in some embodiments, may check each point against a threshold or cutoff value to determine whether the point is rural or urban. Specifically, points having a population density above a minimum threshold would be designated as urban, and those below the threshold would be designated rural. A population density database may also be used in conjunction with an either/or type of rural/urban database, such as that described above, for enhanced accuracy.

Input elevation database 22 according to some embodiments may be a grid map containing topographic data. Each grid point contains an elevation value, usually in meters.

As noted, many of the data sources for input terrain elevation database 22, and particularly those having global coverage, are very large in size. For example, some databases contain approximately 40 GB of data, after exclusion of large water bodies and oceans. A data source of this size is far too large to be practically installed in GNSS receivers, due to the cost and physical size of the memory required. The method of the present invention, according to some embodiments, is able to produce from this input an output DEM 14 that is approximately 10 megabytes in size. This represents a data reduction of about 4,000 to 1. Accordingly, as a database having a compact or reduced size, output terrain elevation database 14 may be relatively easily and cost-effectively installed and used in GNSS receivers 10.

Figure 8:
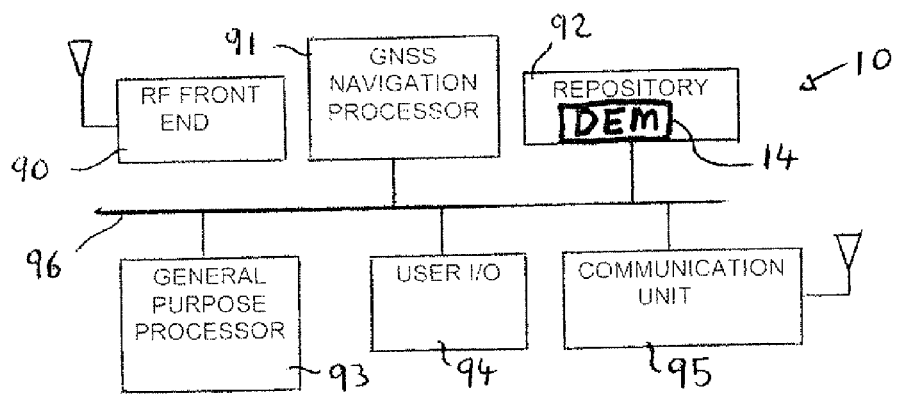
FIG. 8 is a block diagram of a GNSS receiver containing a digital elevation map generated by a method consistent with an embodiment of the present invention.

FIG. 8 is a block diagram showing some of the components of GNSS receiver 10. As indicated, GNSS receiver 10 includes an RF (Radio Frequency) front end 90, a GNSS navigation processor 91, a repository 92, a general purpose processor 93, conventional user input and output devices represented collectively by reference numeral 94, and a communication unit 95. Components 91, 92, 93, 94, and 95 communicate with each other via a common bus 96.

Repository 92 is a non-volatile memory such as a flash memory. As indicated, output database DEM 14 is installed or contained in repository 92, for use by the other elements of GNSS receiver 10, such as GNSS navigation processor 91.

It may be noted that the method of the present invention may be used to obtain an elevation database for other types of geographical locations of interest other than cities or urban areas. For example, location database 18 may contain location information on forests around the world. Rule database 20 could provide pixel by pixel information as to whether a point is forest or not forest. Another database may provide information on the density of vegetation at a point. Similar to the population density database above, a vegetation density database could be used as rule database 20 or in conjunction with an either/or forest database.

Referring now to FIG. 3, it may be seen that processing module 24 broadly functions to receive data from location or city atlas database 18 and rule or rural/urban database 20, processes the data, and produces an output as shown by arrow 25.

Figure 4A:
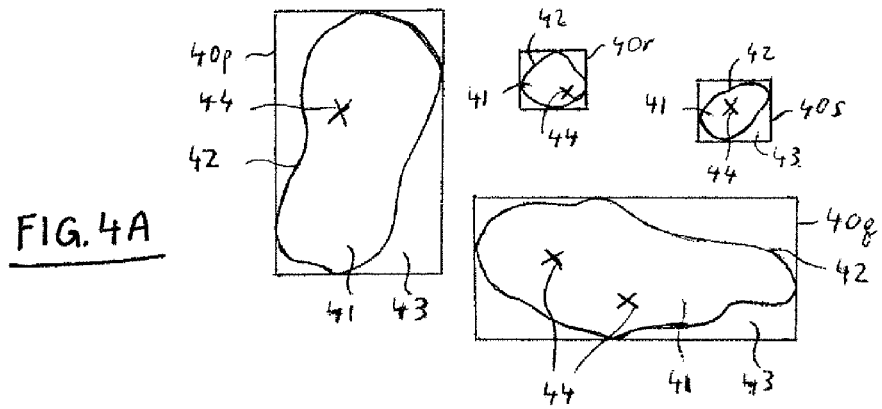
FIG. 4A is a schematic view of a plurality of urban bounding regions in the form of bounding boxes, consistent with an embodiment of the present invention.

An example of the output of processing module 24 is shown in FIG. 4A. The output is a regional database containing at least one urban bounding region 40, and associated data from rural/urban database 20 that is within the boundaries of each urban bounding region. It may be seen that inside each urban bounding region is a continuous urban region 42. Continuous urban region 42 is a substantially close approximation to the actual geographical boundaries or contour of a city or broader urban or municipal area, as defined by the rural/urban database. More particularly, points 41 that are inside continuous urban region 42 are urban, and points 43 that are outside region 42, and inside bounding region 40, are non-urban, such as rural areas or bodies of water.

Urban bounding regions 40 are defined or mapped geographical areas that each enclose or encompass a single continuous urban region 42. According to some embodiments of the invention, urban bounding region 40 may be in the form of a rectangle called a bounding box. The bounding box may be sized and shaped to be the smallest or most optimal size in which to enclose its associated continuous urban region 42, where the sides of the bounding box can be specified in terms of latitude and longitude coordinates. As shown, in the optimal sized bounding box each side of the rectangle is in contact with or is tangential to at least one point of continuous urban region 42. Other forms of urban bounding region 40 are also comprehended by the present invention, such as non-rectangular polygons or curved shapes, or a shape that is substantially coincident with continuous urban region 42. However, it has been found that rectangular, optimally sized bounding boxes produce adequate results, particularly when further processed as described below.

In the example of FIG. 4A it may be seen that there are four urban bounding regions 40, representing four different continuous urban regions 42. Two of the urban bounding regions 40 are large, representing large underlying urban regions 42, and two are relatively small. It may be noted that the four continuous urban regions 42 may actually be located relatively far from one another geographically, and are displayed clustered close to one another in this and other figures for convenient illustration purposes.

FIG. 4A also shows location coordinates 44 which were received from input location database 18. For illustration purposes each location coordinate 44 is shown in the figure by the letter "X". It may be seen that each continuous urban region 42 contains at least one location coordinate 44.

Returning to FIG. 3, the urban region bounding function performed by module 24 may now be described in greater detail. The module loads or receives a city location coordinate 44 from location or city atlas database 18. The module uses this location to define a start position on the grid or other map of rural/urban database 20. More particularly, the module loads data from rural/urban database 20 for this location 44 and a small surrounding area. From the initial position, module 24 performs a search, expanding outwards on a pixel-by-pixel basis, checking the status of each pixel to determine if the pixel is urban, rural, or a body of water. If the outer limit of the loaded data is reached before the urban bounding region 40 is fully defined, module 24 requests and receives a further block of data from rural/urban database 20. It is to be appreciated that by performing the urban region bounding function in steps, it is usually not necessary to load large regions of data at any one time from rural/urban database 20.

This process is repeated until an urban bounding region 40 enclosing an associated continuous urban region 42 is defined. More particularly, the process continues until the smallest bounding box that contains the closed shape of continuous urban region 42 in which the city represented by location coordinate 44 is located, is defined.

It is to be appreciated that, as noted, location coordinate 44 only needs to be somewhere within continuous urban region 42, and does not have to be near the center or any particular point. The bounding region algorithm performed by module 24 can use any starting point to find the closed shape of continuous urban region 42.

Prior to defining the urban bounding regions, module 24 may optionally perform pre-filtering to reduce the amount and time of processing. For example, if location database 18 contains location coordinates for all of Asia, but it is desired to obtain an output elevation database for only one country in Asia, location coordinates 44 belonging to cities outside that country may be pre-filtered in advance. In this way, only locations inside the desired country will be processed by the module. In this example, the pre-filtering may be performed as long as country data for each location coordinate is available, either as part of location database 18 or in a complementary database. In another example, pre-filtering may be done by population if population data is available as part of the input databases.

After all location coordinates 44 from city atlas database 18 are processed and urban bounding regions 40 are defined, module 24 performs a check to determine if any of the urban bounding regions 40 are duplicates of one another. Duplicate urban bounding regions 40 may occur when two or more cities, as represented by their location coordinates 44, are located relatively close to one another and/or are part of the same broad metropolitan region. Since the algorithm of module 24 can start anywhere within the region and recreate the same continuous urban region 42, the same bounding box will be created as well. An example of this is shown in FIG. 4A. It may be seen that urban bounding box 40$q$ encloses two location coordinates 44 from database 18. Accordingly, it is likely that the urban bounding region 40 generated by module 24 for each of these input coordinates 44 would be the same urban bounding region 40$q$. When duplicate urban bounding regions 40 are found, module 24 simply eliminates it, as the extra urban bounding region is redundant and unnecessary.

In some cases module 24 may encounter a very large continuous urban region 42. As it is usually not practical to handle a very large continuous region, a limit is set for the maximal size of a bounded region. In case the size of the continuous region is larger than the limit, module 24 will return an error message stating that the region is too large for bounding. For example, the maximal region size may be defined to be 20 degrees×20 degrees, which is about 3000 km×3000 km. If the urban bounding function reaches this size without arriving at a defined bounding region 40, module 24 suspends further searching and outputs a message that no bounding region was found for that particular urban region. In that case, a manual search may be performed, and the associated data coordinates added to the output data set.

In some cases the starting point location coordinate 44 provided by city atlas database 18 may fall in a point which is not defined as urban. This may occur due to a mismatch between city atlas database 18 and rural/urban database 20, or due to the precision of the rural/urban database grid. For example, the coordinates of cities that are close to water bodies sometimes fall on the body of water rather than on the land side of the shoreline.

According to some embodiments of the invention, when this occurs module 24 may perform an iterative search, expanding outwards from the non-urban location 44, to search for an urban point from which the larger continuous urban region 42 may be found. The search is limited in scope, since it is inevitable that an urban point will be found eventually. In some embodiments, module 24 examines a 3×3 matrix of pixels surrounding the initial non-urban location coordinate 44. If an urban point is not found, the search is expanded to a 5×5 matrix of pixels. If an urban point is still not found, the search is terminated and no urban bounding region 40 is returned for that coordinate. The upper limit of the matrix size may be expanded or reduced by the operator as appropriate. Other types of searching than an expanding box or matrix may also be used.

The output of module 24 as noted is a database of urban bounding regions 40, and accordingly may be called a region atlas database. The database contains at least the coordinates of data structure of each urban bounding region 40 and the associated data from rural/urban database 18. In practical terms, the coordinates of the bounding boxes may be easily and compactly represented by only four points: minimum and maximum latitude, and minimum and maximum longitude. It is to be appreciated that this feature represents a significant advantage of the bounding box embodiment of urban bounding regions 40, as compared to other shapes or to shapes that are substantially coincident with continuous urban region 42. Further, the rural/urban database data may also be compactly represented by a pointer to the associated array or pixel map data, rather than by reproducing the actual data.

The data output of module 24 may also include other types of metadata associated with the region represented by each urban bounding region 40. This may include, for example, names of one or more cities located in each urban bounding region 40, population of the cities or the region, weather or economic information or any other data. It is to be appreciated that individual cities are inputs to module 24, and become part of the region metadata when output from module 24. It is to be appreciated that the database has an open data structure, so that new metadata may be added from additional data sources as they become available.

Processing module 26 may be used to optionally filter the regional database output of bounding region module 24. The output of filter module 26 is shown as arrow 27 in FIG. 3.

Figure 4B:
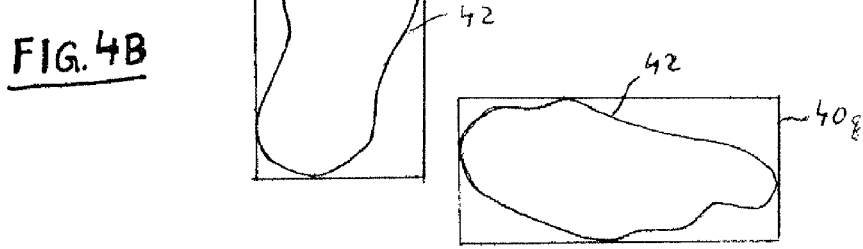
FIG. 4B is a schematic view of the plurality of urban bounding regions of FIG. 4A after some of the urban bounding regions have been removed by filtering.

Filtering may be performed on any of the metadata of the regions in the database, to further reduce the size of the data set. The filter definitions or parameters are determined by the operator according to the desired target output database 14. Examples of filter definitions include: minimum region population, minimum region size, regions having three or more cities, at least one city larger than a certain size or population, regions having a certain percentage of children or amount of precipitation in a year. Filtering may also be done to include only regions from a specific country or continent, if this was not already performed by the pre-filtering function of module 24. FIG. 4B shows the output of filter module 26 upon filtering for regions having a minimum size or area. As indicated, the two small urban bounding regions 40r and 40s are no longer in the data set, which now contains just the two large urban bounding regions 40p and 40q.

Tiles module 28 receives the filtered regional database from filters module 26, and performs the function of dividing each urban bounding region 40 into mapping tiles 46. The output of tiles module 26 is shown as arrow 29 in FIG. 3.

Tiles are simply smaller units of area, and may be set to any size or shape, including rectangular or square. A size and format that has been found to be adequate is a square of 64×64 pixels. FIG. 4C(i) shows the bounding boxes of urban bounding regions 40 divided into tiles 46.

There are two main benefits to dividing the region database into tiles. A first benefit is that it enables convenient storage and indexing of data. Accordingly, when database 14 is used in GNSS receiver 10, an elevation value for any particular location only requires retrieval of the relatively small amount of data for the appropriate tile, rather than data for the whole urban bounding region 40 or entire database 14.

A second benefit is that tiling enables further data reduction through correction of inefficiencies in bounding boxes. As noted in FIG. 4A, data points 43 inside the bounding boxes are non-urban. Keeping this data in the region database is inefficient, as it would not be part of the urban region for which the database is used. Accordingly, tiles module 28 further performs the function of evaluating each mapping tile with respect to rural/urban database 20, and removing from the data set any mapping tiles 46 that are not urban. Mapping tiles 46 that overlap an urban area and are accordingly part urban and part non-urban are generally retained in the data set. Optionally, a threshold parameter for urban content may be set, and only tiles meeting or exceeding the threshold may be retained.

FIG. 4C(ii) shows the resulting urban bounding regions 40 upon removal of non-urban tiles by tiles module 28. It may be appreciated that in the figure tiles along the edge of the regions appear to be cut or split for illustration purposes. In practice tiles 46 are either included or not included, so that each tile 46 in urban bounding regions 40 will be a whole tile.

It may also be noted from FIG. 4C(ii) that upon removal of non-urban tiles, urban bounding regions 40 are no longer in the form of bounding boxes, but rather are now substantially coincident with each boxes' underlying continuous urban region 42. Accordingly, while the bounding box form of urban bounding region 40 may have been initially inefficient in that it included some non-urban data, upon processing by tiling module 28 this issue has been substantially reduced if not eliminated.

The output structure of tiles function module 28 is accordingly the same as the input to the module from filter module 26, but with additional records defining the tiles to produce for each urban region. It is to be appreciated that the spatial filtering process represented by the combination of defining urban bounding regions, applying filters, and dividing the regions into tiles and removing non-urban tiles, has greatly reduced the volume of data required for DEM 14.

At this point the regional data set consists of a plurality of tiles, each tile representing a portion of an urban bounding region 40. Each tile is specified by a set of coordinates defining its location and by its size, which is a common value for all tiles. However, the tiles are empty in that they do not yet contain elevation data.

The process of applying elevation data to the data set is shown in FIG. 3. As indicated, output tiles from tiles module 28 are input to elevation data module 30 at arrow 29. Elevation data from input elevation database 22 is first input to elevation database processing module 32, and from there directed to elevation data module 30.

The data obtained from input elevation database 22 may generally be of high quality. Accordingly, any processing by module 32 is done with great care in order not to impact the measured data. However, processing is appropriate to correct any inherent data flaws that may be present. For example, a small amount of data from input elevation database 22 may have missing data or "holes". Processing module 32 may correct this defect by running a hole filling algorithm, which identifies data holes and replaces the data with the average elevation surrounding the hole. This algorithm may be further improved by performing the fill with a higher order polynomial, rather than by a 0-order method.

Some input elevation data sets are generated using radar measurements. In these data sets the elevation in urban areas is sometimes affected by the presence of tall buildings. Most data sets compensate for this when they are processed before publication, but some residue is sometimes evident. In these cases, it may be possible for processing module 32 to run an algorithm to identify irregular elevation peaks in urban areas and compensate for them.

Figure 4D:
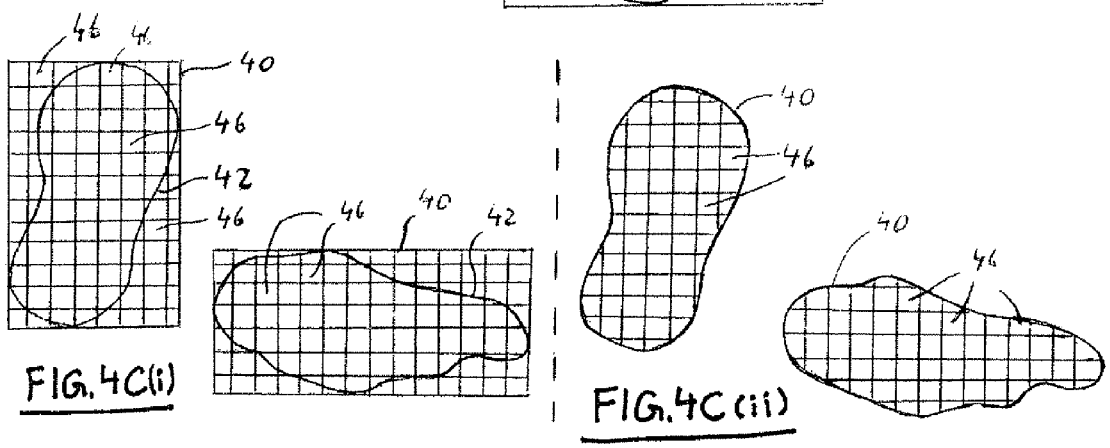
FIG. 4D is a schematic view of the plurality of urban bounding regions of FIG. 4C(ii) where the urban bounding regions contain elevation data.
Figure 4D:
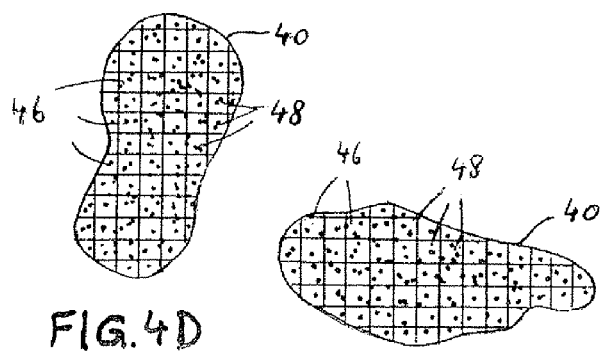

The processed elevation data output from module 32 is received by elevation data module 30, which cross-references or matches the data by location with each individual tile. The output of elevation, data module 30, at arrow 31 in FIG. 3, is illustrated in FIG. 4D. As indicated, tiles 46 in urban bounding regions 40 now contain elevation data, which is shown as dots 48 in the figure. More particularly, the elevation data is applied in the form of image data. Each pixel in each tile contains a byte or other standard unit of information, where the value of the byte indicates the elevation level at that point. Accordingly, the output of elevation data module 30 is a plurality of image files, each file containing the image data of a tile 46 belonging to a particular urban bounding region 40. More generally, the tiles are regions in the memory of a computer with which elevation data is associated. For example, the elevation data may be associated by being copied to the regions in memory, or by being pointed to by the regions in memory.

While the data set required for DEM 14 has been greatly reduced by spatial filtering, the size of the data set may be further reduced by applying a compression function to the plurality of tile images. As shown in FIG. 3, tile image data output from elevation data module 30 at arrow 31 is received and processed by compression module 34.

When compressing the tile image data, any image compression method or file type may be used. One method that has been found to be adequate in some embodiments is the PEG algorithm for image compression.

There is a tradeoff between the amount of compression done to an image and the amount of distortion that results when the compressed data is decompressed. The operator of the method of the present invention, in some embodiments, may determine an appropriate compression/distortion tradeoff for the particular application through selection of certain statistical metric and allowable error parameters.

For example, an operator may determine that a particular minimum error is acceptable if it is not exceeded in at least 95% of the data. This metric represents approximately two standard deviations, and has been found to produce adequate results. Other metric parameter settings may also be used, such as average error or "n-th" largest error.

The operator may also set a parameter of "allowed compression product error". This parameter is expressed in distance units such as meters, and reflects a maximum threshold of the number of meters the uncompressed elevation value may be allowed to differ from its true value. It has been found that a value for allowed compression product error that provides adequate results is 20 meters for 95% of the data.

As will be shown below, compression module 34 may test for these parameters since the original, uncompressed elevation data of each tile is available. Specifically, upon compressing a tile according to certain parameters, the tile may be decompressed and compared to the original data. An error value may be obtained for each pixel, and it can then be determined whether the allowed compression product error has been met for 95% of the data.

Figure 5:
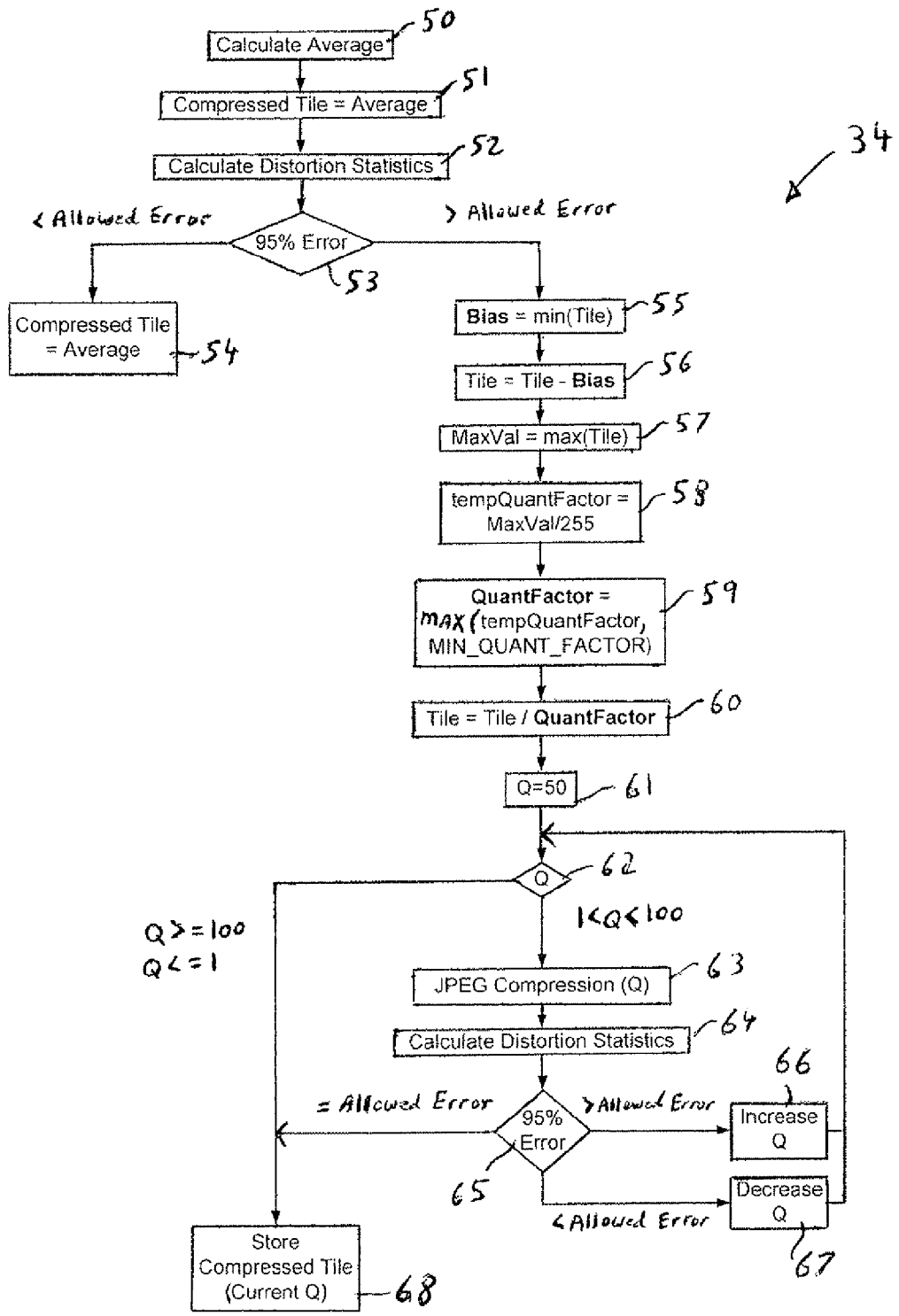
FIG. 5 is a block diagram illustrating a method of image compression, consistent with an embodiment of the present invention.

A block diagram of a method of image data compression that may be performed by compression module 34, according to some embodiments of the invention, is shown in FIG. 5. As noted, the method inputs are the plurality of tile image data files from module 30, and specified parameters for allowed compression product error and data error percentage. The JPEG algorithm for image compression is used, and compression is performed independently for each tile.

The compression algorithm of FIG. 5 may be viewed as having two parts. In the first part, comprising modules 50-54, tiles having little elevation variation are saved as a fixed value. In the second part, comprising modules 55-68, tiles whose elevation varies more than the allowed error are compressed according to an adaptive algorithm, as described in greater detail below.

The compression algorithm accordingly proceeds as follows. In module 50 the average value for the entire tile is calculated. In module 51 the compressed tile is defined to be a fixed value equal to the average value calculated in module 50. Module 52 then calculates the distortion statistics based on this assumed compressed value. Module 53 is a decision module that checks if at least 95% of the data points in the tile have an error that is smaller than the specified allowed error. If the answer is yes, then the elevation data for the tile is considered to be sufficiently invariant that it may be represented as the single, average value, and in module 54 the tile is saved as a fixed value equal to the average elevation. The algorithm then retrieves the next tile data and returns to module 50. It is to be appreciated that saving only the average elevation for an entire tile, for some of the tiles of the overall data set, a highly efficient level of image compression is achieved.

Returning to module 53, tiles for which a fixed elevation equal to the average result in an acceptable error in less than 95% of the data points continue processing by the adaptive compression method of modules 55-68. It may be noted that the JPEG compression method makes use of a quantization factor "Q" which determines the degree or extent of compression. A large Q value produces less compression, and therefore less compression error, and a small Q value produces more compression, and therefore more compression error. In the adaptive compression method described herein, an optimum Q is determined for each tile which enables the maximum possible level of compression for that tile while staying within the 95% error requirement. In the block diagram, modules 55-60 prepare the tile for jpeg compression, and modules 61-68 apply the adaptive JPEG compression algorithm.

Starting at module 55, a minimal value of the tile is calculated and stored in the variable "Bias". Module 56 subtracts Bias from all tile values. The resulting tiles will accordingly have a minimum value of zero. Module 57 calculates the variable "MaxVal", which is the maximal value of the resulting tile. In module 58, a variable "tempQuantFactor" is calculated equal to MaxVal/255. It may be noted that the fixed value 255 is based on the JPEG algorithm, which naturally handles 8-bit grayscale files. Module 59 determines the quantization factor "QuantFactor", according to the formula:

QuantFactor=max(MIN_QUANT_FACTOR, tempQuantFactor)

The parameter "MIN_QUANT_FACTOR" is the minimal allowed quantization factor. Since the original data has a resolution of 1 meter, MIN_QUANT_FACTOR should be greater than or equal to 1. Larger values cause the pre-compression quantization to be coarser. A coarser pre-compression quantization makes it easier to compress the data, while increasing the pre-compression error. Subsequently, in module 60, every value in the tile is divided by QuantFactor.

The adaptive compression procedure may now be applied. Beginning at module 61, Q is assigned an initial value of 50. In decision module 62 the process flow is directed according to whether Q is between 1 and 100 (perform adaptive processing), or greater than 100 or less than 1.

For Q between 1 and 100 control proceeds to module 63, which compresses the tile using JPEG compression and quantization factor Q. Module 64 calculates distortion statistics, and decision module 65 checks the 95% error value. If the error value is larger than the specified allowed error, control passes to module 66 which increases Q, and the process is returned to module 62 for further iteration. Else, if the error value is less than the specified allowed error, control passes to module 67 which decreases Q, and again the process is repeated at module 62.

To further clarify the above process, an error value "larger than the specified allowed error" means that the allowed compression error was met for less than 95% of the data points in the tile. Accordingly, there has been too much compression, and Q is therefore increased, to reduce the extent of compression. Similarly, an error value "less than the specified allowed error" means that the allowed compression error was met for more than 95% of the data points in the file. In this case less compression has been applied than what might be possible, and there is an opportunity to apply more compression, to squeeze the data even further while staying within the 95% error requirement. As a result, Q is decreased, to increase the extent of compression.

The loop defined by modules 62-67 ends when Q=100 or Q=1, or when the 95% error value equals the specified allowed error. The resulting compressed file for the tile is stored in module 68 along with the variables Bias and Quant-Factor required for decompression. The parameter Q is stored as part of the resulting JPEG file, and does not need to be stored independently.

It may be noted that to improve the compression algorithm performance, in some embodiments Q may be changed using a binary search method. This change does not affect the compression performance.

The output of the above JPEG adaptive compression algorithm is a file containing the compressed tile in JPEG format. Tiles that have been saved as a fixed elevation in module 54 produce a dummy output file that contains only a single value for the average tile elevation. When the algorithm has been applied to all of the input mapping tiles, the output from compression module 34 in FIG. 3, shown as arrow 35, is the plurality of compressed tiles.

Further data reduction may be achieved by optional packing module 36. In particular, it has been found that a useful method of packing may be applied in situations where, as in the example above, the JPEG algorithm is used for compressing the elevation data.

As noted, the JPEG algorithm is a highly efficient algorithm for image compression. However, while JPEG achieves an excellent compression ratio for elevation data, saving the entire JPEG file for each tile may be inefficient. A normal JPEG compressed file usually contains two types of information: the compressed data, and a header that contains information necessary to decompress the compressed data.

When working with large images, additional header data is usually negligible. However, the DEM 14 database tiles tend to be small, as noted typically about 64×64 pixels. This increases the relative overhead consumed by the JPEG header, which becomes a significant part of the overall compressed data. To overcome this issue, packing module 36, according to some embodiments, takes advantage of the fact that the DEM 14 database contains many tiles. An analysis of the compressed JPEG files of the DEM 14 database has shown that there is often a large amount of header data that is common between different compressed files. As a result, the headers in a particular DEM 14 database may be classified or indexed. Accordingly, after generating the compressed tile data in module 34, a header classification mechanism in packing module 36 analyses all the compressed files, extracts or identifies all the different headers to create a list of header types, and classifies each file by its header type. Following this analysis, the compressed JPEG files may be split, so that headers are stored in one part of the final DEM 14 database, and the file data, with a header ID pointing to the associated header, is stored in another part of the database.

Figure 6:
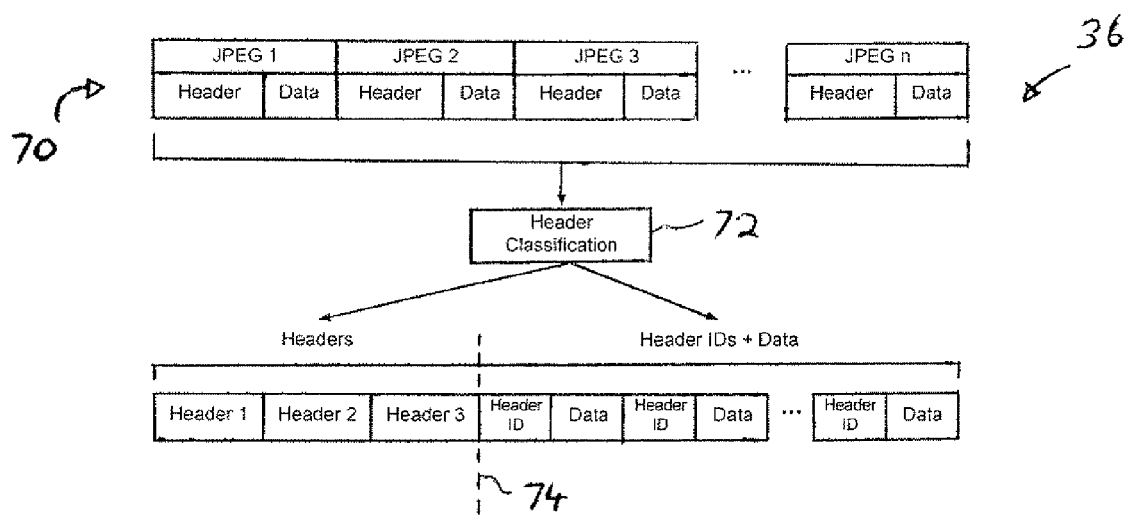
FIG. 6 is a block diagram illustrating a method of image data packing, consistent with an embodiment of the present invention.

This method of packing compressed elevation data, according to some embodiments of the invention, is illustrated in FIG. 6. Initially, as shown at 70, each file of tile elevation data output from module 34 is in the standard JPEG format with its own header and data. Upon performing the header classification function at module 72, the final DEM 14 database may be stored in a split format, with headers grouped together on the left side of line 74, and individual file data and associated header ID's stored on the right side of line 74. In this way, the overall size of output DEM 14 may be reduced even further.

The DEM 14 database product may be stored in a single file or multiple files, and contains the data required to perform elevation lookup for a given location. The packed database is optimized for a convenient and efficient lookup of elevation where the lookup input is a location, given by a set of coordinates (latitude, longitude). In some embodiments the coordinate units in the database are decimal degrees.

Although selected embodiment(s) of the present invention has/have been shown and described, it is to be understood that the present invention is not limited to the described embodiment(s). Instead, it is to be appreciated that changes may be made to this/these embodiment(s) without departing from the principles and spirit of the invention, the scope of which is defined by the claims and the equivalents thereof.

The invention claimed is:

1. A method of generating an elevation database for selected geographic regions, the method comprising:
    (a) receiving a location database that includes coordinates of geographical locations of interest, a rule database including rules for determining for which said geographical locations of interest corresponding bounding regions enclosing continuous geographic regions are to be constructed, and an input elevation database, each location in the location database being located within a selected geographic region;
    (b) for each location in the location database for which, according to said rules from the rule database, a said bounding region enclosing a continuous geographic region is to be constructed: constructing said bounding region;
    (c) applying elevation data from the input elevation database to each bounding region; and
    (d) compressing the elevation data in each bounding region to provide compressed elevation data; wherein, upon decompressing the compressed elevation data, each point in each bounding region represents a level of elevation at that point in the associated selected geographic region.

2. The method of generating an elevation database according to claim 1, further including dividing the bounding regions into a plurality of mapping tiles.

3. The method of generating an elevation database according to claim 2, further including removing from each bounding region any mapping tiles representing areas not from a selected geographic region.

4. The method of generating an elevation database according to claim 2, wherein compressing elevation data comprises separately compressing the elevation data associated with each mapping tile.

5. The method of generating an elevation database according to claim 4, wherein the JPEG method of data compression is used to compress the elevation data associated with the plurality of mapping tiles.

6. The method of generating an elevation database according to claim 5, wherein an average value is calculated for the elevation data associated with each tile, and tiles whose average value produces an allowed compression error for a predetermined minimum portion of the data are assigned a single elevation value equal to the average value.

7. The method of generating an elevation database according to claim 5, wherein the data associated with each tile is compressed by adjusting the JPEG quantization factor to achieve maximum compression for a designated level of distortion.

8. The method of generating an elevation database according to claim 7, wherein the predetermined minimum portion of the data is 95% of the data.

9. The method of generating an elevation database according to claim 7, further including packing the compressed elevation data associated with the plurality of mapping tiles.

10. The method of generating an elevation database according to claim 9, wherein the packing of the elevation data includes classifying JPEG headers by header type, and by storing the header type instead of the header for each mapping tile PEG file.

11. The method of generating an elevation database according to claim 1, wherein each bounding region is in the form of a rectangular bounding box.

12. The method of generating an elevation database according to claim 11, wherein the bounding box is sized and shaped so that each side of the bounding box is in contact with at least one point of the enclosed continuous geographic region.

13. The method of generating an elevation database according to claim 1, further including filtering the selected geographic regions according to minimum population size.

14. The method of generating an elevation database according to claim 1, further including filtering the selected geographic regions according to a designated portion of the world.

15. The method of generating an elevation database according to claim 1, wherein the selected geographic regions are urban regions.

16. The method of generating an elevation database according to claim 15, wherein the location database is a city location database and the rule database is a rural/urban database.

17. A method of generating a terrain elevation database for selected urban regions, the method comprising:
(a) receiving a city atlas database, a rural-urban database, and an input terrain elevation database, the city atlas database containing location coordinates of cities in selected urban regions, the rural-urban database including rules for determining for which said cities corresponding bounding regions enclosing continuous urban regions are to be constructed;
(b) for each location in the city atlas database for which, according to said rules from the rural-urban database, a said bounding region enclosing a continuous urban region is to be constructed: constructing said bounding region;
(c) filtering the bounding regions by removing any bounding regions encompassing selected urban regions having a population lower than a minimum population size;
(d) dividing each bounding region into mapping tiles;
(e) removing from each bounding region any mapping tiles representing non-urban areas;
(f) applying terrain elevation data from the input terrain elevation database to each bounding region, to produce a plurality of mapping tile elevation data files;
(g) compressing the elevation data in the plurality of mapping tile files using the JPEG method of compression, wherein each mapping tile is compressed by adjusting the JPEG quantization factor to achieve maximum compression for a designated level of distortion; and
(h) packing the plurality of compressed mapping tile data files by classifying MEG headers of the mapping tile files by header type, and by storing the header type instead of the header for each mapping tile JPEG file; wherein, upon decompressing the elevation data, each point in each tile represents a level of terrain elevation at that point in the associated selected urban region.

18. The method of generating an elevation database according to claim 15, wherein the location database is a city location database and the rule database is a rural/urban/water database.

19. The method of generating an elevation database according to claim 1, wherein the selected geographic regions are forested regions.

20. The method of generating an elevation database according to claim 1, further comprising deleting duplicate said bounding regions.

21. The method of generating an elevation database according to claim 1, wherein said constructing includes: if, according to said rule database, one of said locations is outside a corresponding said geographic region: searching iteratively for a substitute location inside said corresponding geographic region.

22. The method of generating an elevation database according to claim 1, further including filtering the selected geographic regions according to a criterion selected from the group consisting of demographic profiles and meteorological criteria.

23. The method of generating an elevation database according to claim 1, further comprising editing noise in said elevation database.

* * * * *